United States Patent
Ma et al.

(10) Patent No.: US 9,170,620 B2
(45) Date of Patent: Oct. 27, 2015

(54) POWER SUPPLY UNIT

(71) Applicant: ShenZhen Treasure City Technology Co., LTD., Shenzhen (CN)

(72) Inventors: Jin-Shan Ma, Shenzhen (CN); Wan-Li Ning, Shenzhen (CN)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 0 days.

(21) Appl. No.: 14/192,888

(22) Filed: Feb. 28, 2014

(65) Prior Publication Data
US 2015/0177802 A1 Jun. 25, 2015

(30) Foreign Application Priority Data
Dec. 24, 2013 (CN) .......................... 2013 1 07196653

(51) Int. Cl.
*G06F 1/16* (2006.01)
*G06F 1/26* (2006.01)

(52) U.S. Cl.
CPC ... *G06F 1/26* (2013.01); *G06F 1/16* (2013.01)

(58) Field of Classification Search
CPC ....... G06F 1/187; G06F 1/1632; G06F 1/181; G06F 1/183; G06F 1/1679; G06F 1/1624
See application file for complete search history.

(56) References Cited

U.S. PATENT DOCUMENTS

| | | | | |
|---|---|---|---|---|
| 5,172,305 A | * | 12/1992 | DeWilde | 361/796 |
| 6,229,696 B1 | * | 5/2001 | Lin et al. | 361/679.58 |
| 6,270,046 B1 | * | 8/2001 | Liu et al. | 248/231.9 |
| 6,483,696 B1 | * | 11/2002 | Gan | 361/610 |
| 6,530,628 B1 | * | 3/2003 | Huang et al. | 312/223.2 |
| 7,057,898 B2 | * | 6/2006 | Chen et al. | 361/725 |
| 7,327,567 B2 | * | 2/2008 | Chen et al. | 361/679.41 |
| 7,672,124 B2 | * | 3/2010 | Zhang et al. | 361/679.58 |
| 7,715,177 B2 | * | 5/2010 | Chen et al. | 361/679.01 |
| 7,848,088 B2 | * | 12/2010 | Liu | 361/679.02 |
| 8,077,467 B2 | * | 12/2011 | Chen et al. | 361/726 |
| 8,208,261 B2 | * | 6/2012 | Fan et al. | 361/727 |
| 8,416,569 B2 | * | 4/2013 | Chen et al. | 361/690 |
| 8,553,418 B2 | * | 10/2013 | Li et al. | 361/725 |
| 8,605,441 B2 | * | 12/2013 | Hamand et al. | 361/726 |
| 8,614,889 B2 | * | 12/2013 | Chen et al. | 361/679.6 |
| 8,749,972 B2 | * | 6/2014 | Li | 361/679.58 |
| 8,899,700 B2 | * | 12/2014 | Hsu et al. | 312/223.2 |
| 2004/0223298 A1 | * | 11/2004 | Chen et al. | 361/683 |
| 2005/0152107 A1 | * | 7/2005 | Chen et al. | 361/683 |
| 2005/0185373 A1 | * | 8/2005 | Chen et al. | 361/685 |
| 2006/0139865 A1 | * | 6/2006 | Chen et al. | 361/683 |

(Continued)

*Primary Examiner* — Robert J Hoffberg
*Assistant Examiner* — Hung Dang
(74) *Attorney, Agent, or Firm* — Novak Druce Connolly Bove + Quigg LLP

(57) ABSTRACT

A power supply unit includes a shell, a handle, and a latching assembly. The shell includes an end wall defining a receiving slot and a sidewall perpendicularly extending forward from a side of the end wall. The handle includes a rotating member rotatably installed in the receiving slot. The rotating member includes an operation portion. The latching assembly includes a resilient latching member received in the shell and a sliding member. A front end of the latching member is mounted to the sidewall. The sliding is slidably connected to a rear end of the latching member. The sliding member is capable being received in the latching member. The sidewall defines a through hole. A piece protrudes out from the latching member to extend through the through hole. The rotating member is rotatable such that the operation portion is received in the shell.

8 Claims, 4 Drawing Sheets

(56) References Cited

U.S. PATENT DOCUMENTS

| | | | |
|---|---|---|---|
| 2006/0139866 A1* | 6/2006 | Chen et al. | 361/683 |
| 2010/0124015 A1* | 5/2010 | Chen et al. | 361/679.58 |
| 2011/0043996 A1* | 2/2011 | Chen et al. | 361/679.58 |
| 2011/0273843 A1* | 11/2011 | Chen et al. | 361/690 |
| 2012/0275104 A1* | 11/2012 | Hamand et al. | 361/679.31 |
| 2013/0027875 A1* | 1/2013 | Zhu et al. | 361/679.58 |
| 2013/0176676 A1* | 7/2013 | Keffeler et al. | 361/679.37 |
| 2014/0016263 A1* | 1/2014 | Chang et al. | 361/679.37 |
| 2014/0022723 A1* | 1/2014 | Yang et al. | 361/679.37 |
| 2015/0062801 A1* | 3/2015 | Zhang et al. | 361/679.38 |
| 2015/0077923 A1* | 3/2015 | Rauline | 361/679.39 |
| 2015/0077924 A1* | 3/2015 | Rauline | 361/679.39 |
| 2015/0092340 A1* | 4/2015 | Jau et al. | 361/679.39 |

\* cited by examiner

POWER SUPPLY UNIT

BACKGROUND

1. Technical Field

The present disclosure relates to a power supply unit.

2. Description of Related Art

In an electronic device, such as a computer or a server, some modules, such as power modules, are fixed in a chassis of the electronic device. Each power module includes a latching member for mounting the power module to the chassis, and a handle mounted on a rear end of the power module by screw. However, the latching member and the handle protrude out of the rear end of the power module, and occupy space of the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
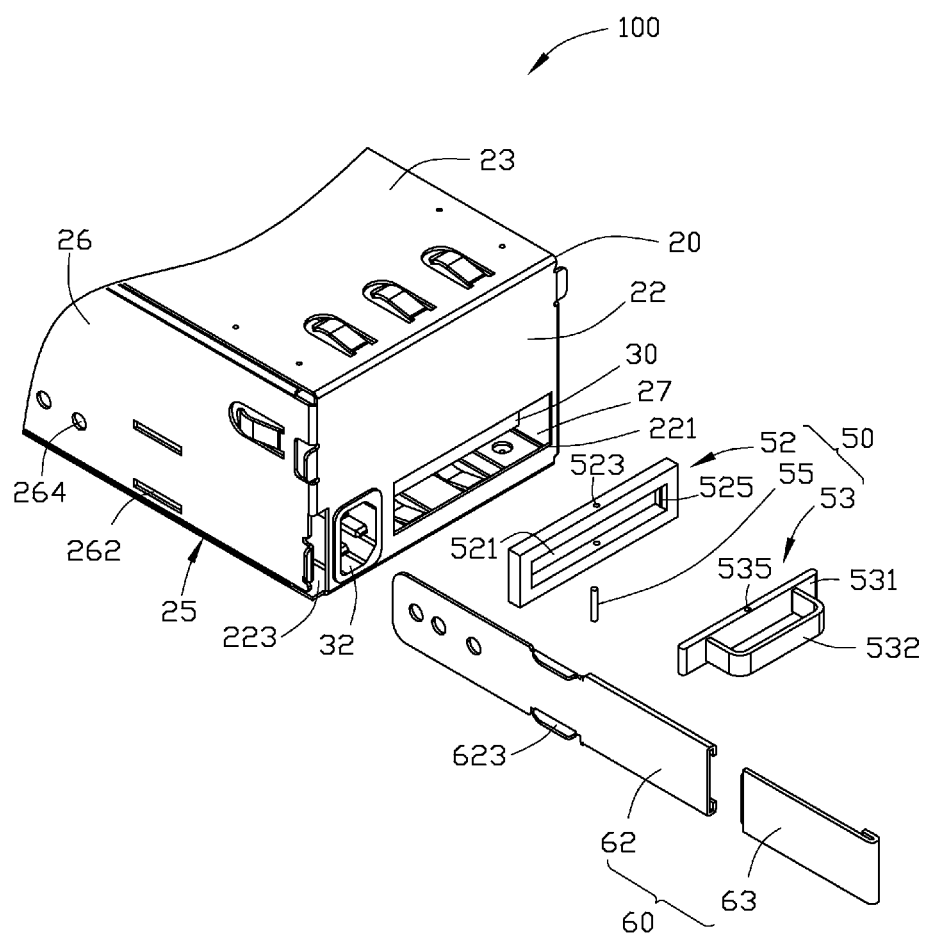
FIG. 1 is an exploded, isometric view of an embodiment of a power supply unit.
Figure 2:
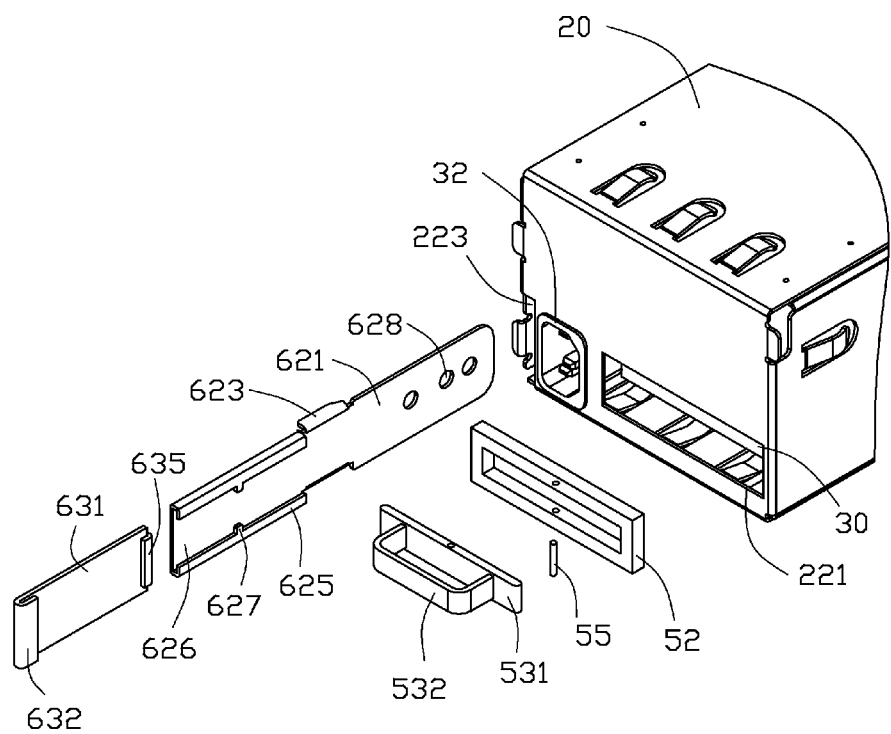
FIG. 2 is similar to FIG. 1, but viewed from another perspective.

FIGS. 1 and 2 show an embodiment of a power supply unit 100 comprises a shell 20, a main body 30 received in the shell 20, a handle 50, and a latching assembly 60.

The shell 20 comprises a rectangular end wall 22, a top wall 23 extending from a top side of the end wall 22, a bottom wall 25 opposite to the top wall 23, and two sidewalls 26 perpendicularly extending from two opposite sides of the end wall 22. The end wall 22, the top wall 23, the bottom wall 25, and the sidewalls 26 cooperatively frame and define a receiving space 27. The main body 30 is received in the receiving space 27. A lower portion of the end wall 22 defines a receiving slot 221 extending along a direction perpendicular to the sidewalls 26. A intersection of one of the sidewall 26 and the end wall 22 defines an inserting hole 223 adjacent to the receiving slot 221, and the sidewall 26 defines two through holes 262 adjacent to the inserting hole 223 and a plurality of mounting holes 264 located at a front of the through holes 262.

The main body 30 comprises a connector 32 exposed out from the end wall 22. The connector 32 is located between the receiving slot 221 and the inserting hole 223.

The handle 50 comprises a rectangular positioning member 52, a rotating member 53, and a shaft 55. A middle of the positioning member 52 defines a positioning slot 521 extending along a lengthwise direction of the positioning member 52. A middle of two opposite sides of the positioning member 52 define two shaft holes 523 communicating with the positioning slot 521. A resilient bar 525 protrudes from one end of the positioning member 52 in the position slot 521.

The rotating member 53 comprises a rectangular rotating plate 531 and a U-shaped operation portion 532 protruding out from a side of the rotating plate 531. A middle of the rotating plate 531 defines a through hole 535 extending through two opposite side surfaces of the rotating plate 531.

The latching assembly 60 comprises a resilient latching member 62 and a sliding member 63. The latching member 62 comprises a rectangular connecting plate 621, two tabs 623 perpendicularly protruding out from a middle of two opposite sides of the connecting plate 621, and two L-shaped flanges 625 extending in toward each other from a rear portion of the two sides of the connecting plate 621. The flanges 625 and the connecting plate 621 cooperatively bound a slide slot 626. Two protuberances 627 protrude from a middle of the flanges 625 toward each other. A front end of the connecting plate 621 defines a plurality of fastening holes 628.

The sliding member 63 comprises a rectangular sliding plate 631, an operation portion 632 protruding in from a rear end of the sliding plate 631, and a stopping portion 635 protruding in from a middle of a front end of the sliding plate 631. The stopping portion 635 is located at the same side as the operation portion 632.

Figure 3:
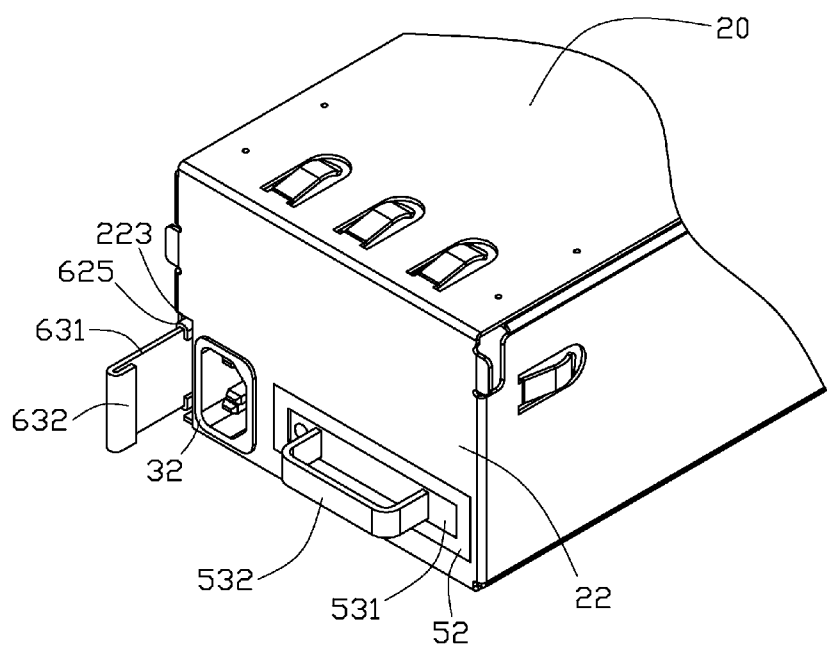
FIG. 3 is an assembled, isometric view of the power supply unit of FIG. 1.

FIG. 3 shows that in assembly, the front end of the sliding member 63 is inserted into the slide slot 626 from the rear end of the latching member 62. The stopping portion 635 abuttingly slides over the protuberances 627, deforming the flanges 625, and then the flanges 625 are restored in such a manner that the protuberances 627 stop the stopping portion 635, thus preventing the sliding member 63 from escaping from the latching member 62. The front end of the latching member 62 is inserted in the inserting hole 223, until the pieces 623 extend through the through holes 262 of the shell 20 and the fastening holes 628 align with the mounting holes 264 of the side wall 26. A plurality of fasteners (not shown) extend through the mounting holes 264, and engage in the corresponding fastening holes 628 of the latching member 623. Thus, the latching assembly 60 is mounted to an inner surface of the sidewall 26 of the shell 20. The latching member 62 is entirely received in the shell 20. The sliding member 63 is slidably received in the latching member 62. The rotating plate 531 is received in the position slot 521. The through hole 535 of the rotating plate 531 aligns with the shaft holes 523. The shaft 55 is latched in the shaft holes 523 of the positioning member 52 and the through hole 535 of the rotating member 53. The rotating member 53 is rotated in the positioning slot 521 of the positioning member 52, and is stopped at the bar 525. The positioning member 52 is latched in the receiving slot 221. The rotating member 53 is rotated around the shaft 55, the operation portion 532 is capable of being received in the receiving space 27 of the shell 20, and one of two opposite ends of the rotating plate 531 is blocked by the bar 525.

Figure 4:
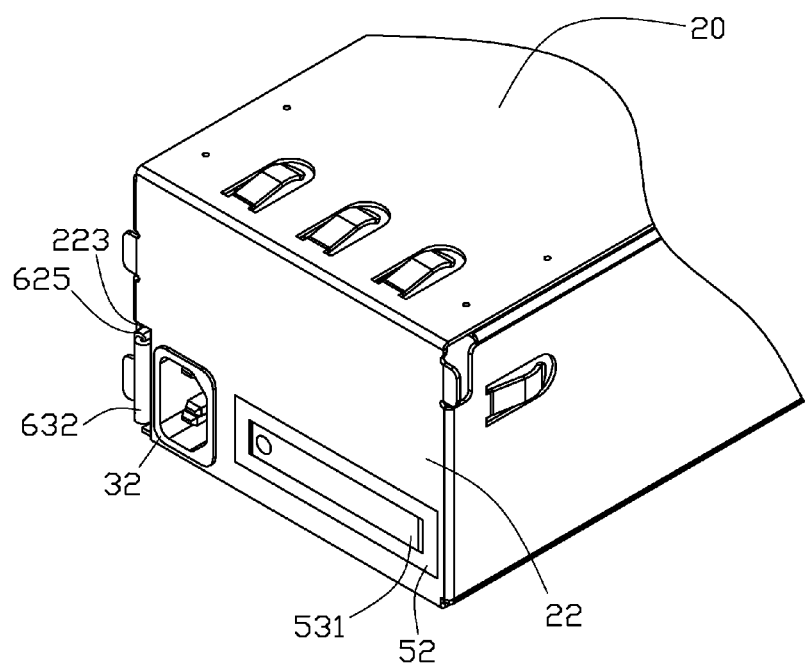
FIG. 4 is similar to FIG. 3, but shows one state of the power supply unit when in use.

When the power supply unit 100 is to be installed in or detached from a chassis of an electronic device (not shown), the rotating member 53 is rotated to expose the operation portion 532 out of the end wall 22 for facilitating manual operation, and one end of the rotating plate 531 is blocked by the bar 525 (as shown in FIG. 3). The operation portion 632 is pulled rearward, to allow the rear end of the sliding member 63 to extend beyond the end wall 22, for facilitating manual operation. Thus, the power supply unit 100 can be expediently operated. When using the rotating member 53 and the sliding member 63 is not needed, the rotating member 53 is rotated in such a manner that the operation portion 532 is hidden in the receiving space 27 of the shell 20, and the other end of the rotating plate 531 is blocked by the bar 525 (as shown in FIG. 4). The sliding member 63 is pushed toward the end wall 22, until the operation portion 632 is stopped by the rear ends of the flanges 625, thus the sliding member 63 is received in the latching member 62. As such, the power supply unit 100 occupies less space.

Even though numerous characteristics and advantages of the embodiments have been set forth in the foregoing description, together with details of the structure and function of the embodiments, the present disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A power supply unit, comprising:
   a shell comprising an end wall defining a receiving slot and a sidewall extending forward from a side of the end wall;
   a handle comprising a rotating member rotatably installed in the receiving slot, wherein the rotating member comprises an operation portion; and
   a latching assembly comprising a resilient latching member received in the shell and a sliding member;
   wherein a front end of the latching member is mounted to the sidewall, the sliding member is slidably connected to a rear end of the latching member, the sliding member is capable of being received in the latching member, the sidewall defines a through hole, a piece protrudes out from the latching member to extend through the through hole, and the rotating member rotates such that the operation portion is received in the shell.

2. The power supply unit of claim 1, wherein the handle further comprises a positioning member latched in the receiving slot, the positioning member defines a position slot, and the rotating member is rotatable in the position slot of the positioning member.

3. The power supply unit of claim 2, wherein the rotating member comprises a rotating plate rotated in the position slot through a shaft, the operation portion protrudes out from a side of the rotating plate, the rotating member is rotated around the shaft, and the operation portion is received in the shell.

4. The power supply unit of claim 3, wherein the positioning member define two opposite shaft holes communicating with the position slot, a middle of the rotating plate defines a through hole aligning with the shaft holes, and the shaft is latched in the shaft holes and the through hole.

5. The power supply unit of claim 3, wherein the positioning member comprises a resilient bar protruding from one end of the positioning member into the position slot, and one of two opposite ends of the rotating plate is detachably latched to the bar.

6. The power supply unit of claim 1, wherein the latching member comprises a connecting plate and two flanges extending from two sides of a rear portion of the connecting plate, the flanges and the connecting plate cooperatively bound a slide slot, the sliding member is received in the slide slot, a front end of the connecting plate is mounted to the sidewall, and the piece is located at a middle portion of the connecting plate.

7. The power supply unit of claim 6, wherein the sliding member comprises a sliding plate received in the slide slot and a stopping portion protruding out from a middle of a front end of the sliding plate, and the latching member further comprises two protuberances protruding from middle portions of the flanges to stop the stopping portion for preventing the sliding member from disengaging from the latching member.

8. The power supply unit of claim 7, wherein the sliding member further comprises a operation portion protruding out from a rear end of the sliding plate, and the operation portion is stopped by rear ends of the flanges of the latching member.

\* \* \* \* \*